(12) United States Patent
Park

(10) Patent No.: US 8,374,034 B2
(45) Date of Patent: Feb. 12, 2013

(54) NONVOLATILE MEMORY DEVICE AND READ METHOD THEREOF

(75) Inventor: Won Sun Park, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 367 days.

(21) Appl. No.: 12/826,584

(22) Filed: Jun. 29, 2010

(65) Prior Publication Data

US 2010/0332773 A1    Dec. 30, 2010

(30) Foreign Application Priority Data

Jun. 29, 2009    (KR) ........................ 10-2009-0058480

(51) Int. Cl.
G11C 16/04    (2006.01)
(52) U.S. Cl. .......... 365/185.18; 365/185.03; 365/189.07
(58) Field of Classification Search ............. 365/189.07, 365/185.03, 185.18
See application file for complete search history.

(56) References Cited

U.S. PATENT DOCUMENTS
2008/0094891 A1*    4/2008    Ho et al. .................. 365/185.03

FOREIGN PATENT DOCUMENTS
KR    1020080012199 A    2/2008

* cited by examiner

*Primary Examiner* — Huan Hoang
(74) *Attorney, Agent, or Firm* — William Park & Associates Ltd.

(57) ABSTRACT

A nonvolatile memory device comprises includes a program unit configured to generate program data, information about the number of program data, and digital sum value information (hereinafter referred to as 'DSVi') of the program data, a memory unit configured to store or read the program data, the information about the number of program data, and the DSVi the program data, and a data read control circuit configured to read program data programmed into the memory unit, generate digital sum value information (hereinafter referred to as 'DSVo') of the read program data, and generate a read voltage control signal using the DSVi of the program data, the DSVo of the read program data, and the information about the number of program data.

12 Claims, 2 Drawing Sheets

NONVOLATILE MEMORY DEVICE AND READ METHOD THEREOF

CROSS-REFERENCE TO RELATED APPLICATION

Priority to Korean patent application number 10-2009-0058480 filed on Jun. 29, 2009, the entire disclosure of which is incorporated by reference herein, is claimed.

BACKGROUND

An exemplary embodiment relates generally to a nonvolatile memory device and a program and read method thereof and, more particularly, to a nonvolatile memory device and a read method thereof by performing an accurate read operation by correcting a read voltage according to the retention characteristic.

Electrically programmable and erasable nonvolatile memory devices, which do not require the refresh function of rewriting data at specific intervals, are in demand.

A flash memory device, one type of nonvolatile memory devices, includes memory cells configured to have their neighboring sources and drains coupled together in series and coupled to a bit line as one unit. Each memory cell typically has a transistor structure in which a floating gate and a control gate are stacked. A memory cell array including the memory cells is directly formed within a P type well formed in a P or N type substrate. The drain of a NAND memory cell is coupled to the bit line via a selection gate, and the source thereof is also coupled to a source line via the selection gate. The control gates of the memory cells are consecutively arranged in the row directions, thus becoming respective word lines.

The operation of a NAND flash memory device is described below. A data write operation is performed from a memory cell farthest away from the bit line and sequentially to other memory cells. High voltage Vpp is supplied to the control gate of the selected memory cell, an intermediate potential is supplied to the control gate of the memory cell on the side of the bit line from the selected memory cell and the selection gate, and 0 V or the intermediate potential is supplied to the bit line depending on data. When 0 V is supplied to the bit line, the same voltage is transferred up to the drain of the selected memory cell, and so electrons are injected into the floating gate at the drain of the selected memory cell. Accordingly, the critical value of the selected memory cell is shifted in the forward direction.

In a distribution of a cell voltage of the flash memory device, the cell voltage can change or is moved with an increase in the period where data is stored. This is called a retention characteristic. During the time for which the data is stored for a long time and program and read operations are continuously performed, the cell voltage is changed or moved, which may lead to a difficulty in the read operation. That is, if a distribution of the threshold voltage of a memory cell is changed because of the retention characteristic, data can be erroneously determined and read by a read voltage fixed during the read operation, thereby causing error in the read operation.

BRIEF SUMMARY

An exemplary embodiment relates to a nonvolatile memory device and a read method thereof, which are capable of performing an accurate read operation by correcting a read voltage according to a retention characteristic during a read operation using the number of input data, a difference in the number of first data and second data from among the input data, a difference in the number of first data and second data from among read program data, and a total number of programmed data.

A nonvolatile memory device according to an aspect of the present disclosure comprises a program unit configured to generate program data, information about the number of program data, and digital sum value information (hereinafter referred to as 'DSVi') of the program data, a memory unit configured to store or read the program data, the information about the number of program data, and the DSVi the program data, and a data read control circuit configured to read program data programmed into the memory unit, generate digital sum value information (hereinafter referred to as 'DSVo') of the read program data, and generate a read voltage control signal using the DSVi of the program data, the DSVo of the read program data, and the information about the number of program data.

The program unit generates the program data by scrambling input data and random data, generates the DSVI of the program data by calculating a difference in the number of first data '0' and second data '1', counts a total number of the program data, and sends the information about the number of program data to the memory unit.

The program unit comprises an input buffer configured to receive input data, a random generator configured to generate random data, and a scrambler configured to generate the program data, the information about the number of program data, and the DSVi of the program data by scrambling the input data and the random data.

The memory unit comprises a memory cell unit configured to store or read the program data, the information about the number of program data, and the DSVi of the program data and a page buffer configured to send the program data, the information about the number of program data, and the DSVi of the program data to the memory cell unit or to store the program data, the information about the number of program data, and the DSVi of the program data.

The memory cell unit comprises normal memory cells configured to store the program data and flag cells configured to store the information about the number of program data and the DSVi of the program data.

The data read control circuit comprises an adder configured to read the program data and generate the DSVo of the read program data by counting the sum of first data or second data during a read operation, a calculator configured to compare the DSVo of the read program data and the DSVi of the program and output a result of the comparison as a control signal, a variable decoder configured to generate variable data on the basis of the information about the number of program data, and a control signal generator configured to generate the read voltage control signal for controlling a read voltage on the basis of the control signal and the variable data.

The variable decoder divides a total number of data programmable into the memory unit into N equal parts and generates the variable data corresponding to the information about the number of program data, from among the N equal parts.

A read method of a nonvolatile memory device according to another aspect of this disclosure comprises programming program data, information about the number of program data, and DSVi of the program data into a memory cell block, reading the program data, the information about the number of program data, and the DSVi of the program data using an initial read voltage, calculating DSVo of the read program data, comparing the DSVi of the program data and the DSVo of the read program data and generating a changed data value as a result of the comparison, standardizing the result of the comparison on the basis of the information about the number of program data, outputting the read program data if the standardized result of the comparison falls within a permitted limit, and increasing a read voltage if the standardized result of the comparison does not fall within a permitted limit, using the increased read voltage during a read operation, and outputting the program data.

The read method further comprises generating the program data by scrambling input data and random data, before programming the program data, the information about the number of program data, and the DSVi of the program data into the memory cell block.

Generating the program data by scrambling input data and random data comprises generating the DSVi of the program data by counting a sum of first data or second data from among the program data and generating the information about the number of program data by counting the program data.

The DSVi of the program data is a difference in the number of the first data and the second data from among the program data.

The DSVo of the read program data is a difference in the number of the first data and the second data from among the read program data.

Standardizing the result of the comparison on the basis of the information about the number of program data comprises generating variable data on the basis of the information about the number of program data and standardizing the result of the comparison using the variable data.

DESCRIPTION OF EMBODIMENT

Hereinafter, an exemplary embodiment of the present disclosure will be described in detail with reference to the accompanying drawings. The figures are provided to allow those having ordinary skill in the art to understand the scope of the embodiment of the disclosure.

Figure 1:
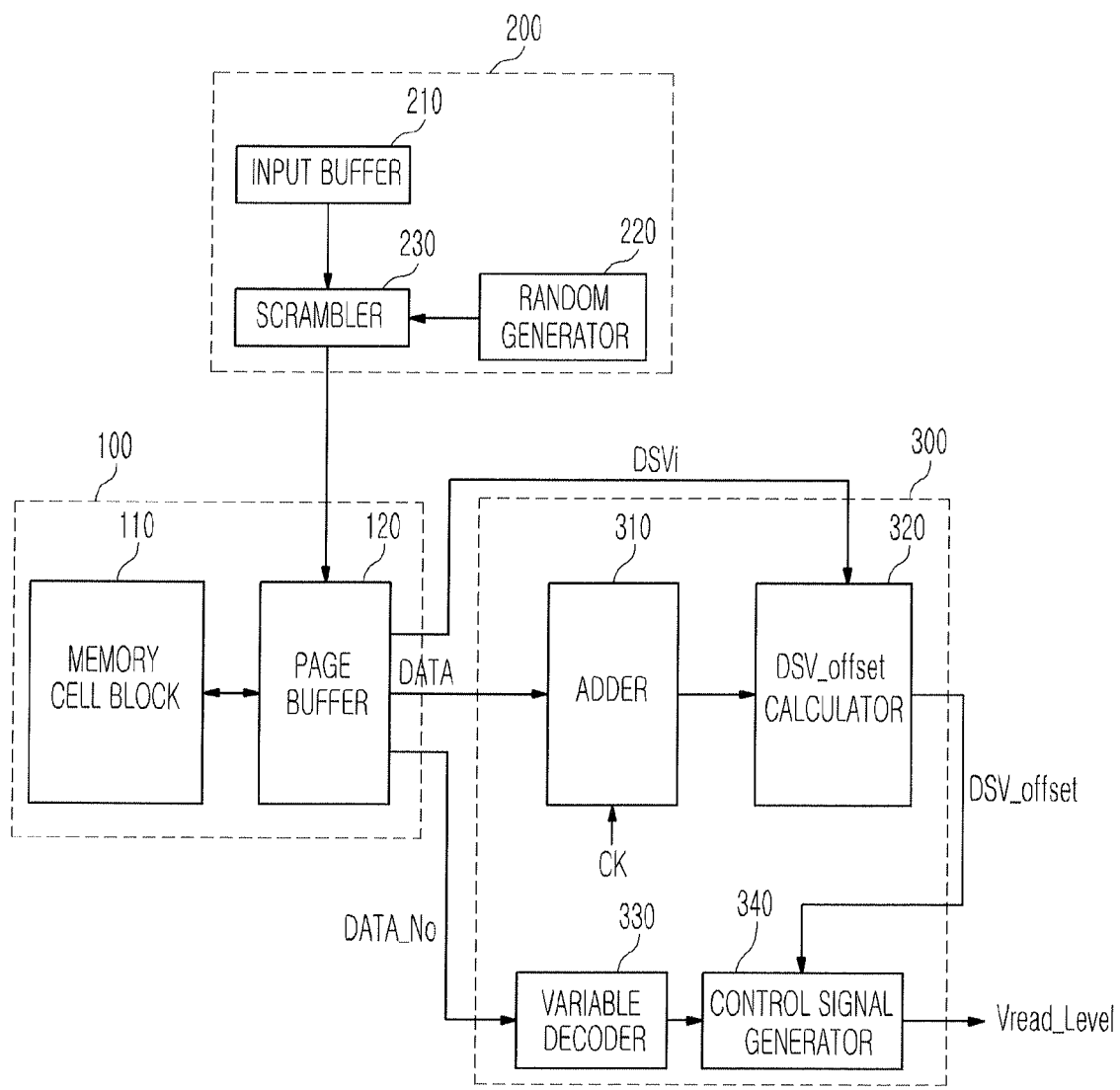
FIG. 1 is a block diagram of a nonvolatile memory device according to an embodiment of this disclosure.

FIG. 1 is a block diagram of a nonvolatile memory device according to an embodiment of this disclosure.

Referring to FIG. 1, the nonvolatile memory device includes a memory unit 100, a program unit 200, and a data read control circuit 300.

The memory unit 100 includes a memory cell block 110 and a page buffer 120. The memory cell block 110 includes normal memory cells and flag cells where the normal memory cells are configured to program and read data, and the flag cells are configured to store special data (e.g., information about the number of program data and first and second digital sum value information (hereinafter referred to as 'DSVi')). The page buffer 120 can send data to the memory cell block 110 for program and read data programmed into the memory cell block 110.

The program unit 200 includes an input buffer 210, a random generator 220, and a scrambler 230.

The input buffer 210 receives input data through an external input pad and sends it to the scrambler 230. The random generator 220 generates random data and sends it to the scrambler 230. The scrambler 230 generates program data using the received input data and the received random data and outputs the program data to the page buffer 120. Further, the scrambler 230 calculates DSVi of first data '0' and second data '1' using the generated program data and counts a total number of the program data DATA_No.

The data read control circuit 300 includes an adder 310, a DSV_offset calculator 320, a variable decoder 330, and a control signal generator 340.

The adder 310 finds a digital sum value during a read operation (hereinafter referred to as 'DSVo') of the first data '0' and the second data '1' from among the program data programmed into the memory cell block 110 by counting the sum of the first data '0' or the second data '1' in response to a clock signal CK. If the sum of one (e.g., the first data '0') of the first and second data '0' and '1' is counted, the sum of the other (i.e., the second data '1') is automatically counted on the basis of a total digital sum. Accordingly, the DSVi of the first data '0' and the second data '1' can be found.

The DSV_offset calculator 320 calculates a value DSV_offset on the basis of the DSVi of the program data stored in a flag cell of the memory cell block 110 during a program operation, and the DSVo of the read program data calculated by the adder 310 during a read operation, and outputs the value DSV_offset to the control signal generator 340 as a control signal.

The variable decoder 330 reads information DATA_No about the number of program data programmed into the memory cell block 110 and generates variable data on the basis of the information DATA_No. For example, assuming that one page of the memory cell block 110 is able to store data of 2 K (2048 bits), the variable decoder 330 can split the one page of data into four ranges and may output the variable data according to which the range of the four ranges would belong to the number of program data. In other words, the variable decoder 330 can output: variable data A when the number of program data is less than 512 B; variable data B when the number of program data is 512 B to 1024 B; variable data C when the number of program data is 1024 B to 1536 B; and variable data D when the number of program data is 1536 B to 2048 B. Although, in an embodiment of the present disclosure, one page is illustrated to be spilt into four ranges; however, the present disclosure is not limited thereto. For example, the variable decoder 330 may split one page into four or more ranges and output the variable data.

The control signal generator 340 generates a read voltage control signal Vread_Level for controlling a read voltage Vread on the basis of the value DSV_offset received from the DSV_offset calculator 320, and the variable data received from the variable decoder 330.

As described above, the difference in the number of first data and second data during a program operation is compared with the difference in the number of first data and second data during a read operation, and a next read voltage is controlled on the basis of the information about the shifted threshold voltage. To more accurately control the read voltage Vread, the number of data changed from the total number of data is calculated using the total number of the data as a variable data, and the read voltage Vread is controlled according to the ratio of the number of data changed and the total number of the data. That is, by standardizing the number of data changed using the number of data changed from the total number of data, the number of changes can be accurately calculated, and a read voltage can be controlled.

Figure 2:
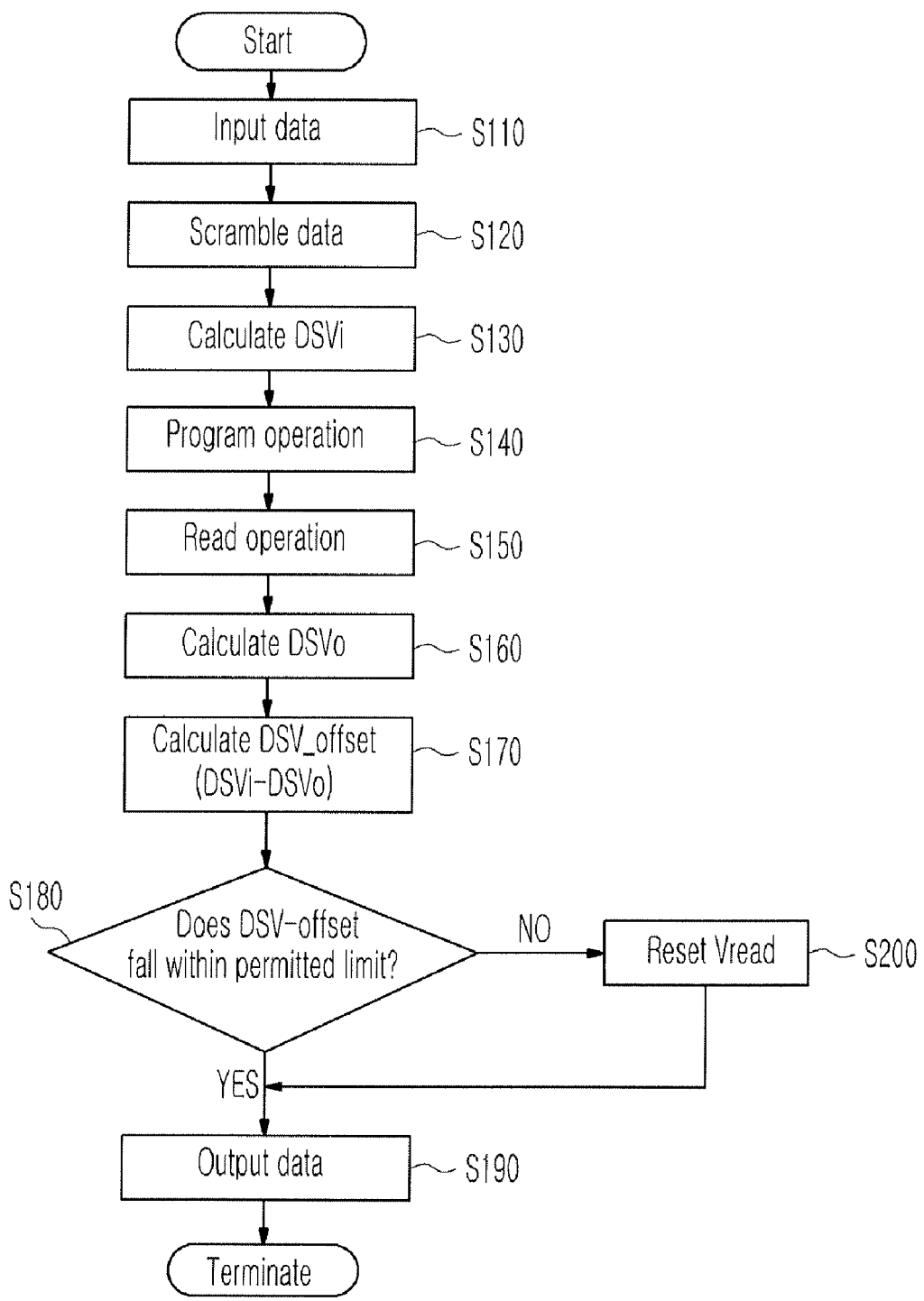
FIG. 2 is a flowchart illustrating a method of controlling a read voltage of the nonvolatile memory device according to an embodiment of this disclosure.

FIG. 2 is a flowchart illustrating a method of controlling a read voltage Vread of the nonvolatile memory device according to an embodiment of this disclosure.

The operation of a nonvolatile memory device is described below with reference to FIGS. 1 and 2.

First, input data are received at step S110. That is, the input data received via an external input pad is inputted to the input buffer 210.

Next, the scrambler 230 having received random data generated by the random generator 220 scrambles the input data and the random data and generates program data DATA at step S120.

At step S130, DSVi is generated by counting the number of the first data '0' and the second data '1' from the program data DATA.

The program data DATA generated by the scrambler 230 is programmed into the memory cell block 110 through the page buffer 120 at step S140. Further, the DSVi and information about a total number of the program data DATA_No are programmed into a flag cell of the memory cell block 110.

Next, at step S150, the program data DATA, the DSVi, and the information DATA_No programmed into the memory cell block 110 are read (i.e., read program data DATA) using the page buffer 120. The read voltage Vread used in this read operation is an initially set read voltage Vread_int.

The adder 310 calculates a DSVo of the first data '0' and the second data '1' in the read operation using the read program data DATA at step S160.

Next, at step S170, the DSV_offset calculator 320 generates the value DSV_offset as a control signal, which is calculated based on the DSVi of the program data determined during the program operation and the DSVo of the read program data determined during the read operation. In this case, the degree of change in the data during the program operation and the read operation is calculated. With increasing threshold voltage distribution, the difference between DSVi and DSVo will increase.

Next, the DSV_offset value is changed on the basis of variable data according to the information DATA_No. That is, the value DSV_offset is changed into a standard value on the basis of the variable data. It is then determined whether the value DSV_offset changed into the standard value as described above falls within a permitted limit. In other words, it is determined whether a next read operation can be performed without resetting the read voltage Vread because the ratio of change in the distribution of a threshold voltage is small at step S180.

If, as a result of the determination, the value of DSV_offset changed into the standard value is determined to fall within the permitted limit, the data read using the page buffer 120 is outputted without resetting the read voltage Vread at step S190. When the data is outputted, the data is descrambled to remove the scrambling due to the scramble operation during the program operation.

However, if, as a result of the determination, the value of DSV_offset changed into the standard value is determined not to fall within the permitted limit, the control signal generator 340 outputs the read voltage control signal Vread_Level to control the read voltage Vread so that a read operation can be performed using a reset read voltage Vread. In general, since a distribution of the threshold voltage is changed, for example, in the right direction because of the retention characteristic, a read voltage preferably is increased and reset.

In accordance with an embodiment of this disclosure, a read voltage is reset according to a retention characteristic during a read operation using the number of input data, the difference in the number of first data and second data from among the input data, the difference in the number of first data and second data from among read program data, and the total number of programmed data. Accordingly, a read operation can be accurately performed.

What is claimed is:

1. A nonvolatile memory device, comprising:
   a program unit configured to generate program data by scrambling input data and random data, information about a number of program data, and digital sum value information of the program data (DSVi);
   a memory unit configured to store or read the program data, the information about the number of program data, and the DSVi of the program data; and
   a data read control circuit configured to read program data programmed into the memory unit, generate digital sum value information of the read program data (DSVo), and generate a read voltage control signal using the DSVi of the program data, the DSVo of the read program data, and the information about the number of program data.

2. The nonvolatile memory device of claim 1, wherein the program unit generates the DSVi of the program data by calculating a difference in a number of first data '0' and second data '1', counts a total number of the program data, and sends the information about the number of program data to the memory unit.

3. The nonvolatile memory device of claim 1, wherein the program unit comprises:
   an input buffer configured to receive input data;
   a random generator configured to generate random data; and
   a scrambler configured to generate the program data, the information about the number of program data, and the DSVi of the program data by scrambling the input data with the random data.

4. The nonvolatile memory device of claim 1, wherein the memory unit comprises:
   a memory cell unit configured to store or read the program data, the information about the number of program data, and the DSVi of the program data; and
   a page buffer configured to send the program data, the information about the number of program data, and the DSVi of the program data to the memory cell unit or to store the program data, the information about the number of program data, and the DSVi of the program data.

5. The nonvolatile memory device of claim 4, wherein the memory cell unit comprises:
   normal memory cells configured to store the program data; and
   flag cells configured to store the information about the number of program data and the DSVi of the program data.

6. The nonvolatile memory device of claim 1, wherein the data read control circuit comprises:
   an adder configured to read the program data and generate the DSVo of the read program data by counting a sum of first data or second data during a read operation;
   a calculator configured to compare the DSVo of the read program data and the DSVi of the program data and output a result of the comparison as a control signal;
   a variable decoder configured to generate variable data on a basis of the information about the number of program data; and
   a control signal generator configured to generate the read voltage control signal for controlling a read voltage on a basis of the control signal and the variable data.

7. The nonvolatile memory device of claim 6, wherein the variable decoder divides a total number of data programmable into the memory unit into N equal parts and generates the variable data corresponding to the information about the number of program data, from among the N equal parts.

8. A read method of a nonvolatile memory device, the read method comprising:
- generating program data by scrambling input data and random data;
- programming program data, information about a number of program data, and DSVi of the program data into a memory cell block;
- reading the program data, the information about the number of program data, and the DSVi of the program data using an initial read voltage;
- calculating DSVo of the read program data;
- comparing the DSVi of the program data and the DSVo of the read program data and generating a changed data value as a result of the comparison;
- standardizing the result of the comparison on a basis of the information about the number of program data;
- outputting the read program data if the standardized result of the comparison falls within a permitted limit; and
- increasing a read voltage if the standardized result of the comparison does not fall within a permitted limit, using the increased read voltage during a read operation, and outputting the program data.

9. The read method of claim 8, wherein generating the program data by scrambling input data and random data comprises:
- generating the DSVi of the program data by counting a sum of first data or second data from among the program data; and
- generating the information about the number of program data by counting the program data.

10. The read method of claim 8, wherein the DSVi of the program data is a difference in a number of the first data and the second data from among the program data.

11. The read method of claim 8, wherein the DSVo of the read program data is a difference in a number of the first data and the second data from among the read program data.

12. The read method of claim 8, wherein standardizing the result of the comparison on a basis of the information about the number of program data comprises:
- generating variable data on a basis of the information about the number of program data; and
- standardizing the result of the comparison using the variable data.

* * * * *